(12) United States Patent
Blatchford et al.

(10) Patent No.: US 8,663,879 B2
(45) Date of Patent: Mar. 4, 2014

(54) GATE CD CONTROL USING LOCAL DESIGN ON BOTH SIDES OF NEIGHBORING DUMMY GATE LEVEL FEATURES

(71) Applicant: Texas Instruments Incorporated, Dallas, TX (US)

(72) Inventors: James Walter Blatchford, Richardson, TX (US); Yong Seok Choi, Kyunggi-do (KR); Thomas J. Aton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/887,651

(22) Filed: May 6, 2013

(65) Prior Publication Data

US 2013/0244144 A1    Sep. 19, 2013

Related U.S. Application Data

(62) Division of application No. 12/915,974, filed on Oct. 29, 2010, now Pat. No. 8,455,180.

(51) Int. Cl.
*G03F 1/36* (2012.01)

(52) U.S. Cl.
USPC .............................................. 430/5

(58) Field of Classification Search
USPC .............................................. 430/5
See application file for complete search history.

(56) References Cited

U.S. PATENT DOCUMENTS

| | | |
|---|---|---|
| 2005/0216877 A1 | 9/2005 | Pack et al. |
| 2007/0134921 A1 | 6/2007 | Tian et al. |
| 2008/0014684 A1 | 1/2008 | Blatchford et al. |
| 2008/0166889 A1 | 7/2008 | Rathsack et al. |

*Primary Examiner* — Mark F Huff
*Assistant Examiner* — John S Ruggles
(74) *Attorney, Agent, or Firm* — Jacqueline J. Garner; Wade J. Brady, III; Frederick J. Telecky, Jr.

(57) ABSTRACT

A method of forming an IC including MOS transistors includes using a gate mask to form a first active gate feature having a line width $W_1$ over an active area and a neighboring dummy feature having a line width 0.8 $W_1$ to 1.3 $W_1$. The neighboring dummy feature has a first side adjacent to the first active gate feature, and a nearest gate level feature on a second side opposite the first side. The neighboring dummy feature defines a gate pitch based on a distance to the first active gate feature or the neighboring dummy feature maintains a gate pitch in a gate array including the first active gate feature. The spacing between the neighboring dummy feature and the nearest gate level feature (i) maintains the gate pitch or (ii) provides a SRAF enabling distance that is ≥2 times the gate pitch and the gate mask includes a SRAF over the SRAF distance.

4 Claims, 5 Drawing Sheets

GATE CD CONTROL USING LOCAL DESIGN ON BOTH SIDES OF NEIGHBORING DUMMY GATE LEVEL FEATURES

CROSS REFERENCE TO RELATED APPLICATIONS

This application is a divisional of U.S. Nonprovisional patent application Ser. No. 12/915,974 filed Oct. 29, 2010, now U.S. Pat. No. 8,455,180 issued Jun. 4, 2013 the contents of which are herein incorporated by reference in its entirety.

FIELD

Disclosed embodiments relate to integrated circuits (ICs) including semiconductor fabrication, and more particularly to photolithography for forming gate electrodes including dummy gate level features for ICs comprising MOS devices

BACKGROUND

Lithographic projection apparatus (tools) can be used, for example, in the manufacture of ICs. When using the various tools, a mask can be used that contains a circuit pattern corresponding to an individual layer of the IC, and this pattern, usually having many designs, can be imaged onto a target portion (e.g., comprising one or more dies) on a substrate, such as a silicon or other wafer comprising a semiconductor surface, that has been coated with a layer of radiation-sensitive material, such as a resist. In general, a single wafer may contain a network of adjacent target portions that can be successively irradiated using a projection system of the tool, one at a time.

One of the goals in IC fabrication is to faithfully reproduce the original IC design on the wafer using the mask. Another goal is to use as much of the wafer area as possible. As the size of an IC is reduced and its density increases, however, the critical dimension (CD) of its corresponding mask approaches the resolution limit of the optical exposure tool. The resolution for an exposure tool can be defined as the minimum feature sizes that the exposure tool can repeatedly expose on the wafer. The resolution value of exposure tools often constrains the CD for many advanced IC designs.

A particularly important fabrication process employed in IC fabrication that includes MOS transistors is the gate electrode (hereafter the "gate") etch process, such as a polysilicon gate etch process, which is commonly utilized for forming MOS transistors. The gate etch process is important in terms of device operation and CDs. Better or tighter control of the gate etch process results in benefits including better device characteristics, improved device performance, and/or improved device yield. Collectively these benefits improve device yield and/or produce devices with additional intrinsic value (e.g., better performance, lower heat dissipation, lowered leakage current). Thus, a stable, accurate and precise gate etch process for ICs MOS transistors is important.

Gate CD control is becoming more critical and more difficult to achieve node on node. Attention is focused on controlling the CD for gate. For example, polysilicon gate pitch restrictions and dummy features at the ends of gate arrays have been used to improve gate CD performance vs. lithography process variation.

SUMMARY

Disclosed embodiments are based on the discovery of an unexpected new pitch effect where the spacing of the neighboring dummy gate level features (hereafter "neighboring dummy features") to the next gate level feature (e.g., another dummy feature or an active (i.e., integrated circuit (IC) connected) gate on the opposite side of an active gate feature can have a significant impact on CD control of the active gate, being particularly significant for gate CDs beginning at the 45 nm node. As demonstrated in the Examples described below, use of disclosed neighboring dummy feature pitch and width restrictions that design the local environment around the neighboring dummy feature on both of its sides provide an unexpected and significant process margin improvement (e.g., CD process window widening) for the active gate feature over conventional disregard for the local environment around the neighboring dummy feature on the side opposite the active gate feature.

In one embodiment this new pitch effect is realized by providing pitch-matching for the nearest gate level feature for the neighboring dummy feature on the side opposite the active gate feature the neighboring dummy feature is serving. In another embodiment, the new pitch effect is realized by providing a space sufficient to the nearest gate feature for the neighboring dummy feature to allow a sub-resolution assist feature (SRAF) to be included on the gate mask in the space provided on the mask. As used herein, a neighboring dummy feature is an extra printed feature that is positioned adjacent to an end active gate that enables improved patterning particularly for the end active gate feature. The neighboring dummy feature (or any other dummy feature on the IC) can be subsequently removed after its printing, or remain on the final IC in which case the neighboring dummy feature will be an electrically isolated (i.e., unconnected) feature.

Disclosed embodiments based on this unexpected pitch effect include methods of forming ICs including a plurality of MOS transistors that provide improved gate CD control by designing the local environment on both sides of neighboring dummy features, lithography mask sets that include related circuit patterns, and computer readable mediums comprising program code stored on physical computer media that configures a processor to perform a method of designing a lithography mask set that designs the local environment on both sides of the neighboring dummy features.

DETAILED DESCRIPTION

Figure 1:
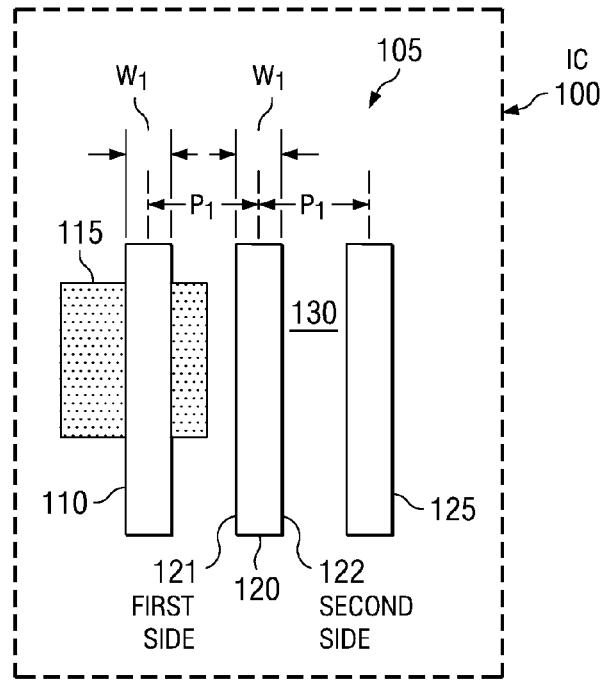
FIG. 1 is a simplified depiction of a printed gate portion within an IC after gate patterning including a plurality of MOS transistors including neighboring dummy feature pitch and width restrictions, according to a disclosed embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a simplified depiction of a printed gate portion 105 within an IC 100 after gate patterning including a plurality of MOS transistors including neighboring dummy feature pitch and width restrictions. A gate mask is used to form gate level features including a first active gate 110 that has a line width $W_1$ formed over an active area 115 and at least one neighboring dummy feature 120 having a line width $0.8 W_1$ to $1.3 W_1$ shown=$W_1$. The first active gate feature 110 is an end active gate since it is positioned at an end of active area 115. The neighboring dummy feature 120 is on a field region 130, such as on trench isolation (e.g., shallow trench isolation (STI)). The neighboring dummy feature 120 has a first side 121 adjacent to the first active gate feature 110 and a nearest gate level feature 125 on its second side 122 opposite to the first side 121. In one embodiment, the gate level features 110, 120, 125 can comprise polysilicon. However, disclosed embodiments can utilize gate electrode materials other than polysilicon.

The neighboring dummy feature 120 defines a gate pitch on the first side 121 shown as $P_1$ based on a distance (shown as a center-to-center distance) to the first active gate feature 110. Alternatively, in the case of a gate array (see FIG. 2B described below), the neighboring dummy feature 120 is positioned to maintain a gate pitch in the gate array which includes the first active gate feature 110. Nearest gate level feature 125 is shown maintaining the gate pitch $P_1$ for neighboring dummy feature 120 on the second side 122 opposite first active gate feature 110. As used herein "maintaining a gate pitch" refers to providing a narrow pitch range for the neighboring dummy feature 120 by positioning the nearest gate level feature 125 on the second side 122 of the neighboring dummy feature 120 opposite the last (end) active gate shown as first active gate feature 110 so that a regular (fixed) pitch or at least a near-regular pitch defined herein as being within 15% of the pitch between the neighboring dummy feature and the end active gate is provided. In the case of a gate array, "maintaining a gate pitch" refers to the pitch on both sides of neighboring dummy feature 120 being within 15% of the nominal pitch in the case of the gate array. This is aspect is described for gate arrays below with respect to FIG. 2B.

The same gate mask can be used to form first active gate feature 110, neighboring dummy feature 120, and nearest gate level feature 125. The spacing between the neighboring dummy feature 120 and the nearest gate level feature 125 is shown maintaining the gate pitch $P_1$. Although nearest gate level feature 125 is shown as another dummy feature, in other embodiments nearest gate level feature 125 can be another active gate.

Alternatively, as described below, the spacing between the neighboring dummy feature 120 and the nearest gate level feature 125 can be at a sub-resolution assist feature (SRAF) enabling distance that is defined herein as being 2 times the gate pitch ($P_1$ in FIG. 1), and the gate mask includes a SRAF over the SRAF enabling distance. As known in the art, a SRAF is a mask feature that is too narrow to print for a given lithography system, such as ≤½ the minimum feature size printable using the given lithography system.

Figure 2A:
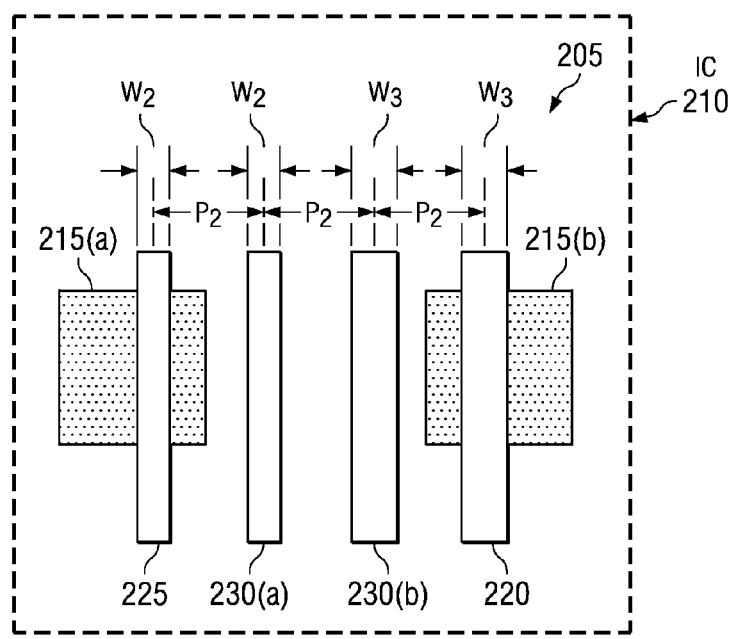
FIG. 2A is a simplified depiction of a printed gate portion within an IC after gate patterning including a plurality of MOS transistors including neighboring dummy feature pitch and width restrictions, according to a disclosed embodiment.

FIG. 2A is a simplified depiction of a printed gate portion 205 within an IC 210 after gate patterning including a plurality of MOS transistors including neighboring dummy feature pitch and width restrictions. Printed gate portion 205 includes an active area 215(a) and an active area 215(b). A first active gate feature 225 having a line width $W_2$ is formed over active area 215(a), and a second active gate feature 220 having a line width $W_3$ is formed over active area 215(b). A first neighboring dummy feature 230(a) having a line width=$W_2$ is positioned on a side of the first active gate feature 225 that defines a pitch $P_2$. A second neighboring dummy feature 230(b) having a line width=$W_3$ ($W_3>W_2$) is positioned on a side of the second active gate feature 220 to maintain the gate pitch $P_2$ shown by providing a pitch $P_2$ with respect to first neighboring dummy feature 230(a) and second active gate feature 220. Printed gate portion 205 can be seen to satisfy the rules that each active gate feature 225 and 220 have an associated gate level feature shown as first and second neighboring dummy feature 230(a) and 230(b), respectively, having a width 0.8 to 1.3 (shown equal, i.e. 1.0) of its width of the gate feature adjacent to it, and the respective neighboring dummy features 230(a) and 230(b) also have pitch-matched features (a pitch=$P_2$ shown) on both of their sides.

Figure 2B:
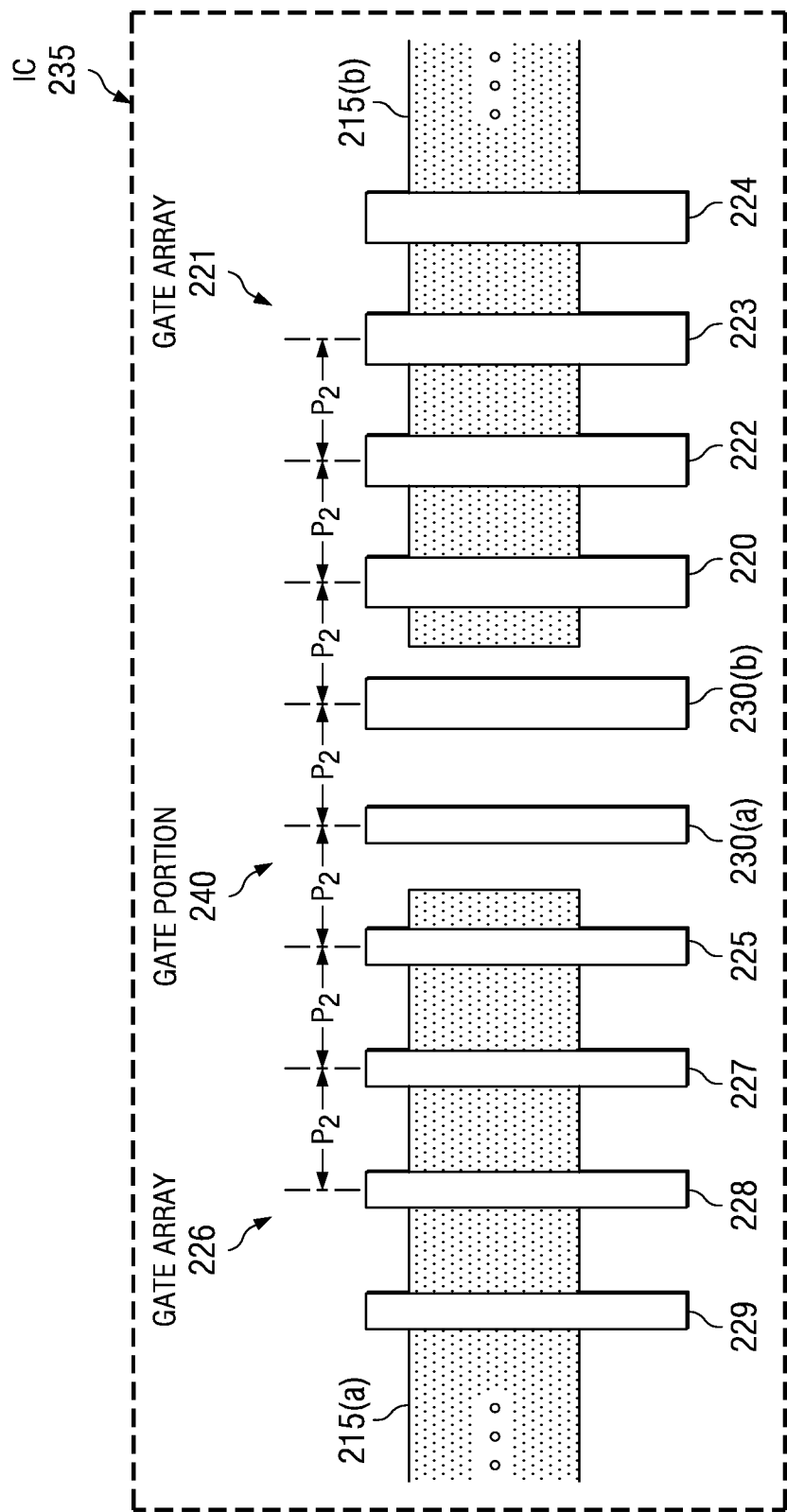
FIG. 2B is a simplified depiction of a printed gate portion within an IC after gate patterning including a plurality of MOS transistors including neighboring dummy feature pitch and width restrictions, according to another disclosed embodiment.

FIG. 2B is a simplified depiction of a printed gate portion 240 within an IC 235 after gate patterning including a plurality of MOS transistors including neighboring dummy feature pitch and width restrictions. Printed gate portion 240 is analogous to printed gate portion 205 shown in FIG. 2A, except active gates features 225 and 220 are now each within gate arrays 226 and 221, respectively, comprising a plurality of active gates features or dummy features, shown as active gate features or dummy features 227-229 and 222-224, respectively.

Printed gate portion 240 can be seen to maintaining the gate pitch by preserving a narrow pitch range requirement for gate features beyond the last/end active gate features 225 and 220 in the gate arrays to not only provide a spacing relationship between the respective gate features in the gate arrays 226 and 221 to one another, but also for the neighboring dummy features 230(a) and 230(b) by positioning their respective nearest gate level features (nearest feature 230(b) for neighboring dummy feature 230(a) and nearest feature 230(a) for neighboring dummy features 230(b)) on a side of the neighboring dummy features opposite the last active gate features 225 and 220 in the gate arrays so that a regular (constant) pitch or a near-regular pitch defined herein as being within 15% of the nominal pitch in the gate arrays is also provided for the neighboring dummy features 230(a) and 230(b). Maintaining the gate pitch as disclosed herein has been found to allow the scanner illumination condition to be tailored to improve process margin for that specific narrow pitch range.

Printed gate portion 240 can be seen to satisfy the same rules as printed gate portion 205 with each active gate feature 225 and 220 having an associated gate level feature 230(a) and 230(b), respectively, having a width 0.8 to 1.3 (shown equal, i.e.=1.0) of the width the gate adjacent to it, and the neighboring dummy features 230(a) and 230(b) both having pitch-matching (pitch=$P_2$) on both of their sides. Printed gate portion 240 represents a disclosed embodiment where the active gate features 225 and 230 are minimum size active gates on the IC 235, and in one embodiment a majority of the minimum size active end gates on the IC that include neighboring dummy features include disclosed dummy feature pitch restrictions.

Figure 2C:
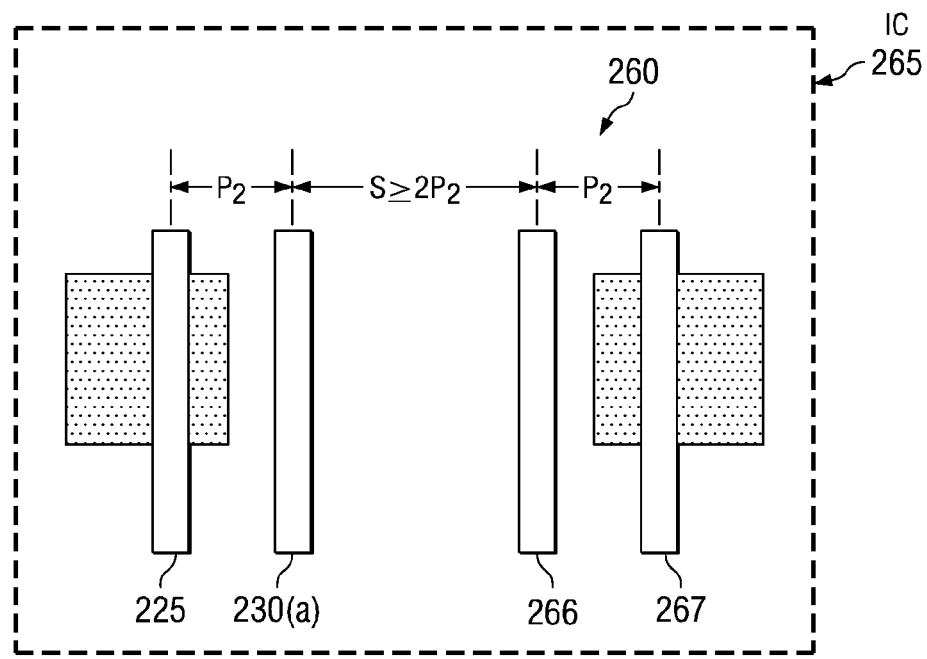
FIG. 2C is a simplified depiction of a printed gate portion within an IC after gate patterning including a plurality of MOS transistors including neighboring dummy feature pitch and width restrictions, according to another disclosed embodiment.

FIG. 2C is a simplified depiction of a printed gate portion 260 within an IC 265 after gate patterning including a plurality of MOS transistors including neighboring dummy feature pitch and width restrictions. As shown, the spacing (S) between the neighboring dummy feature 230(a) and its nearest gate level feature 266 opposite its active gate feature 225 is at a sub-resolution assist feature (SRAF) enabling distance that is ≥2 times the gate pitch $P_2$ (S≥$2P_2$), and in one embodiment is ≥$3P_2$. In this embodiment the gate mask includes a SRAF over the SRAF enabling spacing S. It can also be seen that the same spacing S is between neighboring dummy feature 266 and its nearest gate feature 230(a) opposite its active gate feature 267. In one embodiment the SRAF is positioned to pitch-match both the neighboring dummy feature 230(a) and its nearest gate feature 266 if mask rules for the gate mask allow pitch-matching to both the neighboring dummy feature and the nearest gate level feature. When mask rules for the gate mask do not allow pitch-matching to both the neighboring dummy feature and nearest gate level feature, the SRAF on the gate mask can be centered between the neighboring dummy features.

Figure 2D:
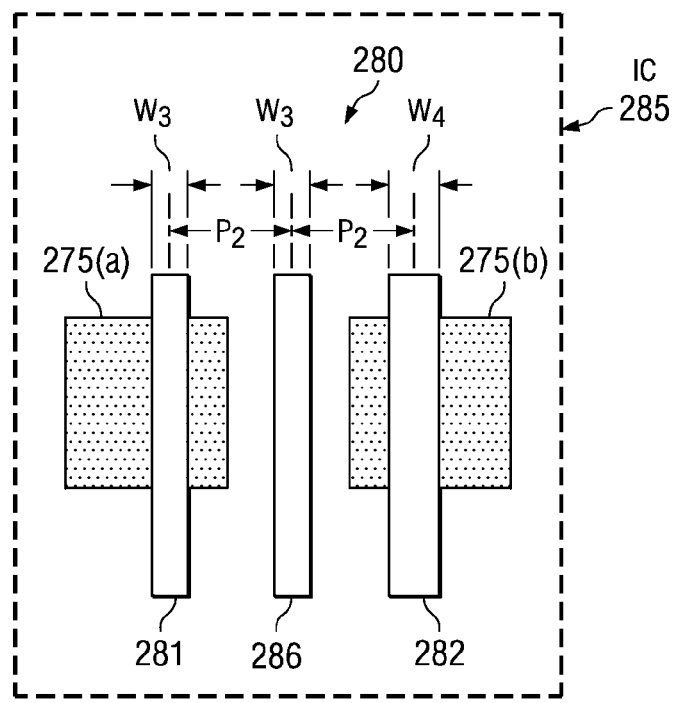
FIG. 2D is a simplified depiction of a printed gate portion within an IC after gate patterning including a plurality of MOS transistors that maintains a gate pitch on both sides of the neighboring dummy feature but does not include neighboring dummy feature width matching.

FIG. 2D is a simplified depiction of a printed gate portion 280 within an IC 285 after gate patterning including a plurality of MOS transistors that maintains a gate pitch on both sides of neighboring dummy feature, but does not include disclosed neighboring dummy feature width matching. Printed gate portion 280 includes an active area 275(a) and an active area 275(b). A first active gate feature 281 having a line width $W_3$ is formed over active area 275(a), and a second active gate feature 282 having a line width $W_4$ is formed over active area 275(b). First active gate feature 281 and second active gate feature 282 are both end gates. A neighboring dummy feature 286 that has a line width=$W_3$ is positioned between first active gate feature 281 and second active gate feature 282.

Although neighboring dummy feature 286 provides pitch-matching for both first active gate feature 281 and second active gate feature 282, neighboring dummy feature 286 may not be able to provide a width between 0.8 and 1.3 of the width of both the first active gate feature 281 and second active gate feature 282 as they are significantly different from one another. Accordingly, printed gate portion 280 may not be allowed based on neighboring dummy feature width restrictions disclosed herein. Without disclosed neighboring dummy feature pitch and width restrictions, it is expected CD control for worst case layouts (e.g., at a spacing just below where a SRAF can be inserted, such as about 0.8 $P_1$ described above) would be about 4-5 times worse as compared to same worst case layout modified to include neighboring dummy feature pitch and width restrictions disclosed herein.

According to a disclosed embodiment a lithography mask set is provided comprising a gate mask that provides disclosed neighboring dummy feature pitch and width restrictions that designs the local environment on both sides of the neighboring dummy features as disclosed herein. As known in the art, the mask layout refers to a circuit schematic used to make a semiconductor device. The mask layout is used to form the respective masks and the mask design refers to geometric shapes on the mask layout that correspond to mask features formed on a mask and/or features formed in/on the substrate. The term "mask," as used herein, can be broadly interpreted as referring to a device comprising mask features that can be used to endow an incoming beam with a patterned cross-section, corresponding to a target pattern, that is to be created in/on a target portion of a substrate.

According to a disclosed embodiment a computer readable medium can be used to generate the masks including a gate mask to form the gate level portion of an IC. The computer readable medium can comprise program code stored on physical computer media that can configure a processor to perform various steps used to make the IC.

Figure 3A:
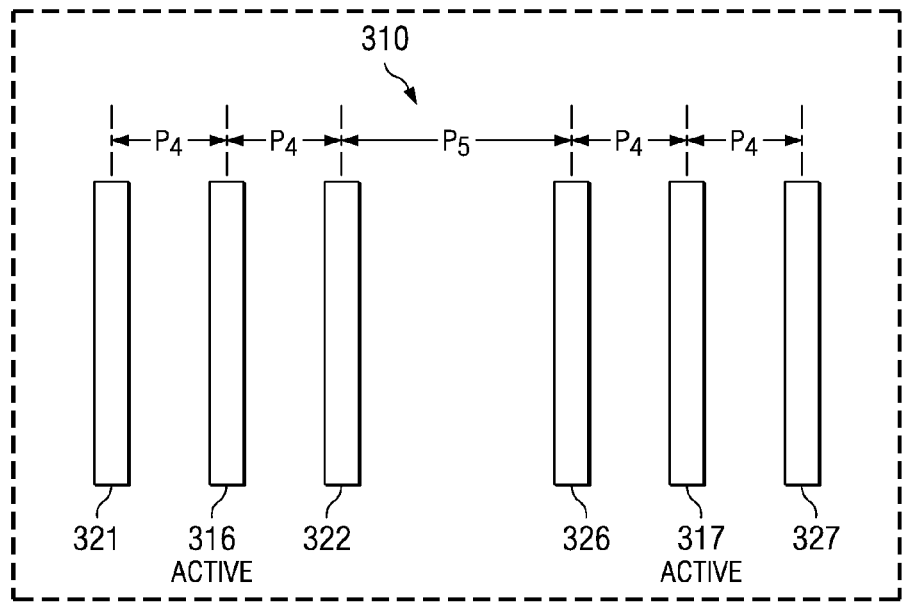
FIGS. 3A and 3B show an example conventional printed gate portion where the pitch beyond the neighboring dummy feature is unrestricted (and thus is a don't care) and the resulting CD process window, respectively.
Figure 3B:
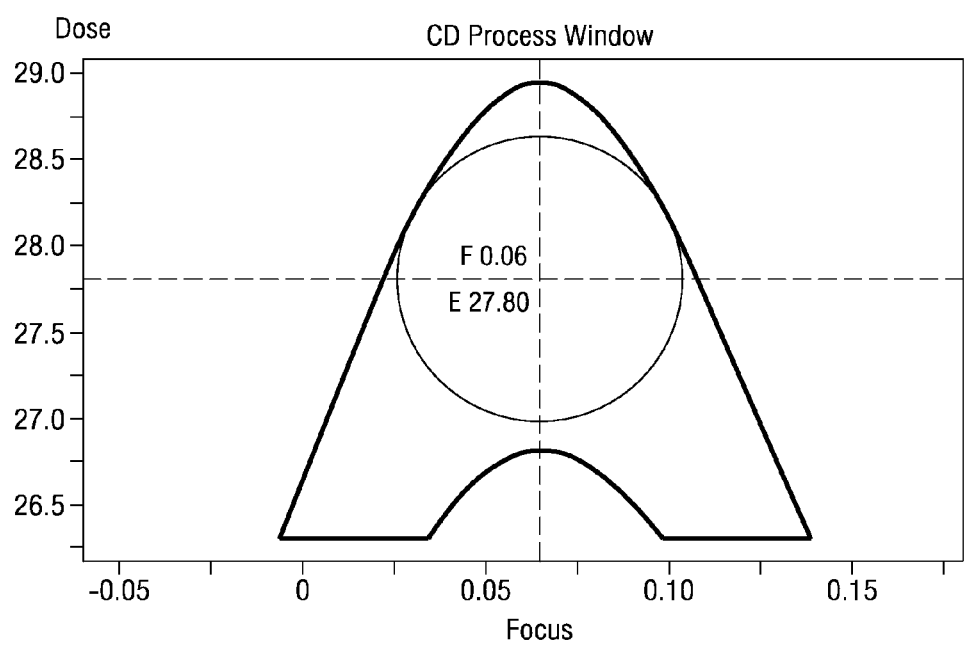

FIGS. 3A and 3B show an example conventional printed gate portion 310 where the pitch beyond the neighboring dummy feature is unrestricted (and thus a don't care) and the resulting CD process window, respectively. Each active gate feature such as active gate features 316 and 317 in printed gate portion 310 includes dummy features 321, 322 and 326, 327, respectively, on both of its sides, that has a minimum dimension and a pitch shown as $P_4$, the pitch for example being 110 nm. The pitch $P_5$ between neighboring dummy features 322 and 326 can be seen to be substantially larger than $P_4$ and <$2P_4$ (not a SRAF enabling distance as disclosed herein), thus not providing the neighboring dummy feature pitch restrictions disclosed herein. The resulting CD process window shown in FIG. 3B includes a depth of focus (DOF) of 0.078 μm at a wavelength of 193 nm (with immersion). In these cases, the gate CD will be out of spec on the small side under reasonable defocus and exposure conditions. In general, this will cause excessive gate leakage. In extreme cases, it is also possible the gate could collapse during the lithography or etch process and not be present on the final IC, or could drift off and print in a location that produces an unwanted short circuit.

Figure 3C:
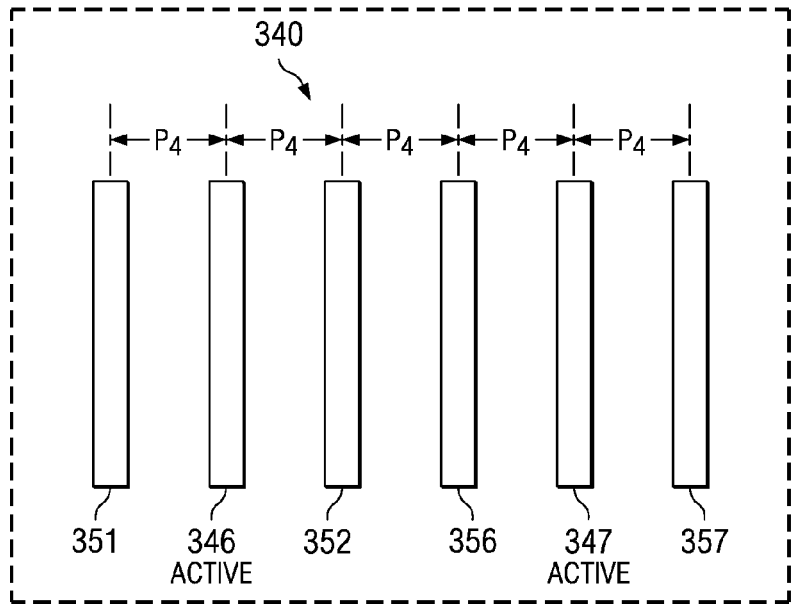
FIGS. 3C and 3D show an example printed gate portion according to a disclosed embodiment where the pitch beyond the neighboring dummy feature maintains the gate pitch, and the resulting CD process window, respectively.
Figure 3D:
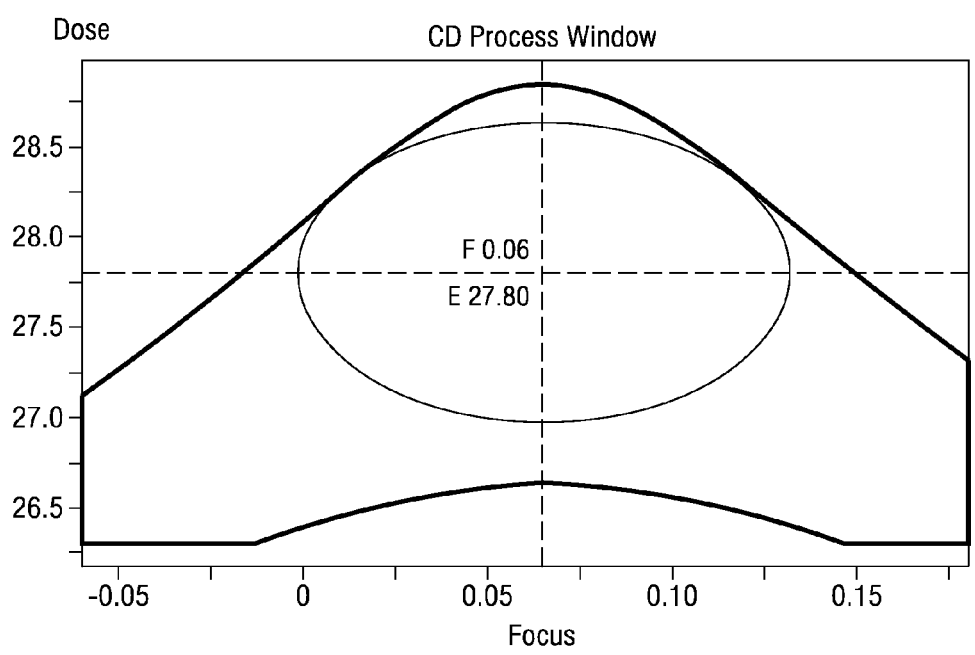

FIGS. 3C and 3D show an example gate portion 340 where the pitch beyond the neighboring dummy feature maintains the gate pitch as disclosed herein, and the resulting CD process window, respectively. Each active gate feature such as active gate features 346 and 347 in printed gate portion 340 includes neighboring dummy features 351, 352 and 356, 357, respectively, on both of their sides, and have a minimum dimension and a pitch shown as $P_4$, which may be for example 110 nm. The pitch between dummy features 352 and 356 can also be seen to be =$P_4$, which thus conforms to neighboring dummy feature pitch restrictions disclosed herein. The resulting CD process window shown in FIG. 3D includes a DOF of 0.133 μm, a significant improvement over the DOF of 0.078 provided for conventional printed gate portion 310 shown in FIG. 3B. Resulting printing results will generally include excellent CD control, and no concern for pattern collapse.

Although reference is made herein to the use of disclosed embodiments in the manufacture of semiconductor devices, such as ICs, it is to be understood that disclosed embodiments have many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text can be considered as being replaced by the more general terms "mask", "substrate", and "target portion", respectively.

The active circuitry formed on the wafer semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A lithography mask set comprising:
a gate mask including neighboring dummy feature pitch restrictions, comprising:
   a first active gate feature having a first line width $W_1$ over an active area and a neighboring feature having a second line width=$0.8 W_1$ to $1.3 W_1$, said neighboring dummy feature having a first side adjacent to said first active gate feature, and a nearest gate level feature on a second side opposite to said first side;
   wherein said neighboring dummy feature defines a gate pitch based on a distance to said first active gate feature or said neighboring dummy feature is positioned to maintain a gate pitch in a gate array including said first active gate feature; and
   wherein a spacing between said neighboring dummy feature and said nearest gate level feature provides one of: (i) maintaining said gate pitch and (ii) being at a sub-resolution assist feature (SRAF) enabling distance that is $\geq 2$ times said gate pitch and said gate mask includes a SRAF over said SRAF enabling distance.

2. The lithography mask set of claim 1, wherein said first active gate feature is one of a plurality of minimum size active end gates, and wherein at least a majority of said plurality of minimum size active end gates include said neighboring dummy feature pitch restrictions.

3. The lithography mask set of claim 1, wherein said SRAF is positioned for pitch-matching to both said neighboring dummy feature and said nearest gate level feature when mask rules for said gate mask allow pitch-matching to both said neighboring dummy feature and said nearest gate level feature.

4. The lithography mask set of claim 1, wherein said SRAF is positioned in a center between said neighboring dummy feature and said nearest gate level feature when mask rules for said gate mask do not allow pitch-matching to both said neighboring dummy feature and said nearest gate level feature.

* * * * *